(12) United States Patent
Kozai

(10) Patent No.: US 6,463,567 B1
(45) Date of Patent: Oct. 8, 2002

(54) LSI DESIGN SYSTEM THROUGH MODEL CREATION FOR FUNCTIONAL BLOCK AND LSI DESIGN METHOD THEREFOR

(75) Inventor: Kazuhiro Kozai, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/387,198

(22) Filed: Aug. 31, 1999

(30) Foreign Application Priority Data

Sep. 3, 1998 (JP) .......................................... 10-249726

(51) Int. Cl.[7] .............................................. G06F 17/50
(52) U.S. Cl. ................................................. 716/2; 716/8
(58) Field of Search .............................. 716/2, 4, 5, 6, 716/7, 8

(56) References Cited

U.S. PATENT DOCUMENTS 6,169,968 B1 * 1/2001 Kabuo .......................... 703/14
6,216,252 B1 * 4/2001 Dangelo ........................ 716/1
6,223,333 B1 * 4/2001 Kuribayashi ................. 716/12

FOREIGN PATENT DOCUMENTS

JP 7-28877 1/1995 ........... G06F/17/50

OTHER PUBLICATIONS

Anderson, "A designer's view of chip test". Oct. 1995. IEEE. p. 292.*

Nummela, "Strategies for implementation independent DSP system development using HDL based design automation". Sep. 1992. IEEE. pp. 214–218.*

* cited by examiner

Primary Examiner—John F. Niebling
Assistant Examiner—Stacy A Whitmore
(74) Attorney, Agent, or Firm—Hayes Soloway P.C.

(57) ABSTRACT

Model creation is executed using a CAD tool, and a delay model and an area model having area information for a functional block estimated from technology-independent logical information is directly created without creating a netlist. A floorplan arranges the area model in functional blocks created through model creation processing in an intended chip size frame and carries out wiring thereof, and estimates validity for the chip size and extracts resistance (R) and parasitic capacitance (C) of wiring around the area model at the same time. Static timing analysis uses the delay model and the wiring RC information created in functional blocks to extract critical paths at a chip level with a CAD tool.

5 Claims, 5 Drawing Sheets

FIG. 4

```
module block1 ( out1, a, b, sel, clk, rstb );

input [7:0] a, b ;
    input clk, rstb, sel ;
    output [7:0] out1 ;
    reg [7:0] qa, qb, qadd ;
    reg qsel ;
    always @(posedge clk)
        if (rst) begin
            qa <=0 ;
            qb <=0 ;
        end
        else begin
            qa <=a ;
            qb <=b ;
            qadd <= qa + qb ;
            qsel <= sel ;
        end
    assign out1 = (qsel) ? qadd : ~qadd ;

endmodule
```

LSI DESIGN SYSTEM THROUGH MODEL CREATION FOR FUNCTIONAL BLOCK AND LSI DESIGN METHOD THEREFOR

BACKGROUND OF THE INVENTION

1. Field of the Invention

The present invention relates to an LSI design system through model creation for a functional block for executing logical synthesis, automatic layout and wiring from a hardware description language (HDL), and an LSI design method therefor.

2. Description of the Related Art

The LSI design method to which the present invention relates uses a logical synthesis tool especially for circuit design and an automatic layout tool for layout and wiring.

Since such an LSI design method generally uses languages such as verilog or VHDL in which functions are represented as text-based RTL description and circuits are automatically created through logical synthesis, it is not necessary to perform manual design on a circuit diagram basis. This enables a substantial reduction in TAT (Turn Around Time: time for design and development) in circuit design and a substantial, improvement in quality in the face of larger scale LSIs. Additionally, the LSI design method has other advantages such as easy application to other products since it allows technology-independent design. Layout or wiring can be performed by interfacing the automatically created circuits as a netlist to the automatic layout tools.

However, the larger scale of LSIs in recent years has increased the TAT for logical synthesis and layout or wiring. In this situation, it is required to estimate a chip size and to improve a critical path in early stages of design.

To satisfy these requirements, JP-A-7-288777, for example, proposes a design support apparatus which, in RTL description for circuit design for designing data path sections and control sections in a circuit as separate blocks in terms of layout, executes schematic design in a block with a plurality of layout schemes to accurately estimate the area of the circuit and operational speed.

The approach disclosed in the aforementioned prior art literature shown in FIG. 1, however, does not have a configuration for executing model creation directly from RTL description for a functional block.

For this reason, the area of circuit and operational speed can not be estimated unless layout design is executed at the level of primitive cells (INV, AND, OR or the like) within a functional block.

Additionally, since the quality of a netlist (information on circuit connection) is substantially affected by the degree of completion of a hardware description language (HDL), the estimated area is greatly increased or decreased if a functional block has a smaller degree of completion.

As a result, there exists a disadvantage that the TAT before the estimation of the area of circuit and operational speed is increased which makes it difficult to estimate them in the early stages of design.

SUMMARY OF THE INVENTION

It is a main object of the present invention to provide an LSI design system through model creation for a functional block which directly creates a delay model and an area model for a floorplan from an HDL in functional blocks without depending on the degree of completion of the HDL, executes the floorplan and static delay analysis in early stages, and knows and improves a chip size and critical path in early stages of design, and an LSI design method therefor.

The LSI design system through model creation for a functional block according to the present invention comprises an HDL description for a functional block described in an HDL (Hardware Description Language); model creating means for creating a delay model and an area model from the HDL description; a library of the delay model in functional blocks having information on a delay path defined with an outline of the functional block serving as its boundary and having an input, output, and input/output terminal serving as its starting point and ending point; a library of the area model in functional blocks having area information for a functional block estimated from technology-independent logical information, terminal information, and wiring prohibited position information; floorplan means for arranging the area model in an intended chip size frame and carrying out wiring thereof, and estimating validity for the chip size and extracting wiring RC information of resistance and parasitic capacitance of wiring around the area model at the same time; the wiring RC information extracted by the floorplan means; and static timing analyzing means for extracting critical paths at a chip level with a CAD tool by using the delay model and the wiring RC information.

The model creating means may include conversion processing means for converting the HDL description for a functional block into a technology-independent; logical structure; an area information table not having area information of cells of all primitive circuits provided for each technology, but having average values of areas of the cells classified based on types of the cells and the number of input pins and output pins; a delay information table having delay values from a pin to another pin in a connection relationship, the values being average values of delays in cells classified based on the number of pins similarly to the area information table; and modeling means for executing modeling from the logical structure converted by the conversion processing means, the area information table, and the delay information table into the area model and the delay model. The modeling means for modeling into the area model may have means for obtaining the area model using an area value extended at a specified rate from the total area of respective circuits in the technology-independent logical structure in consideration of wiring region in the model. The modeling means for modeling into the delay model may have means for modeling a critical path delay from an input pin of a functional block through a combination circuit to a DFF as a setup time for the input pin of the functional block, a critical path delay from a DFF through a combination circuit to an output pin as a delay time from a clock to the output pin of the functional block, and a critical path delay from an input pin through a combination circuit to an output pin as a delay time from the input pin to the output pin.

The modeling means for modeling into the area model may have means for directly providing an area value to create an area model.

A LSI design method for the LSI design system through model creation for a functional block comprises the steps of: describing the HDL description; creating the delay model and the area model from the HDL description with the model creation means; arranging the area model in an intended chip size frame and carrying out wiring thereof, and estimating validity for the chip size and extracting wiring RC information of resistance and parasitic capacitance of wiring around the area model at the same time with the floorplan means; and extracting critical paths at a chip level with a CAD tool by using the delay model and the wiring RC information with the static timing analyzing means.

The step of creating the delay model and the area model may include the steps of: converting the HDL description for a functional block into a technology-independent logical structure with the conversion processing means; and executing modeling from the logical structure converted by the conversion processing means, an area information table, and a delay information table into the area model and the delay model with the modeling means. The area information table may not have area information of cells of all primitive circuits provided for each technology, but may have average values of areas of the cells classified based on types of the cells and the number of input pins and output pins. The delay information table may have delay values from a pin to another pin in a connection relationship, the values being average values of delays in cells classified based on the number of pins similarly to the area information table. The step of modeling into the area model may have the step of obtaining the area model using an area value extended at a specified rate from the total area of respective circuits in the technology-independent logical structure in consideration of wiring region in the model. The step of modeling into the delay model may have the step of modeling a critical path delay from an input pin of a functional block through a combination circuit to a DFF as a setup time for the input pin of the functional block, a critical path delay from a DFF through a combination circuit to an output pin as a delay time from a clock to the output pin of the functional block, and a critical path delay from an input pin through a combination circuit to an output pin as a delay time from the input pin to the output pin.

The step of modeling into the area model may have the step of directly providing an area value to create an area model.

The present invention is characterized in that it provides a method for estimating a chip size and improving a critical path in early stages in an LSI design method for executing logical synthesis, automatic layout and wiring from a conventional hardware description language (HDL) divided for functional blocks.

Accordingly, since delay model 3 and area model 4 in functional blocks with no limitation to their scale are processed as a library, the number of libraries is extremely reduced, for example, as compared to the case of using a netlist in primitive functions such as INV, AND, OR, thereby reducing the TAT for processin[0087] for floorplan 5 and static timing analysis 7.

Therefore, it is easy to estimate a chip size and improve a critical path in early stages of design.

Additionally, it is possible to easily select among a plurality of architectures while models for only one functional block are replaced.

Furthermore, since an area value can be manually inputted or a rate at which an estimated value is increased can be specified in creating the area model, the quality of the floorplan is not dependent on the degree of completion of the HDL, and in extreme cases the chip size can be estimated in early stages of design without an HDL.

BRIEF DESCRIPTION OF THE DRAWINGS

FIG. 4 is a diagram showing an example of HDL description for a functional block.

DETAILED DESCRIPTION OF THE PREFERRED EMBODIMENTS

Figure 1:
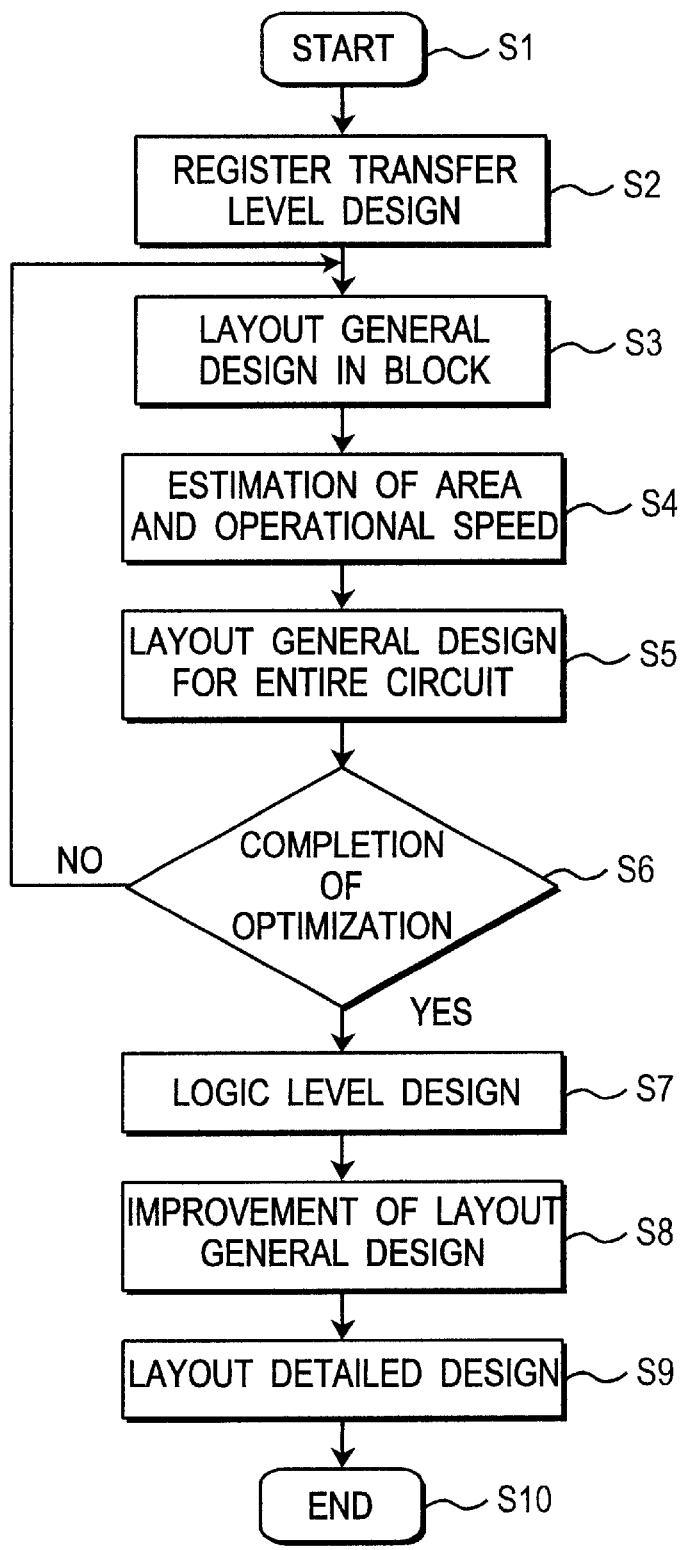
FIG. 1 is a diagram showing a design flow disclosed in JP-A-7-28877.
Figure 2:
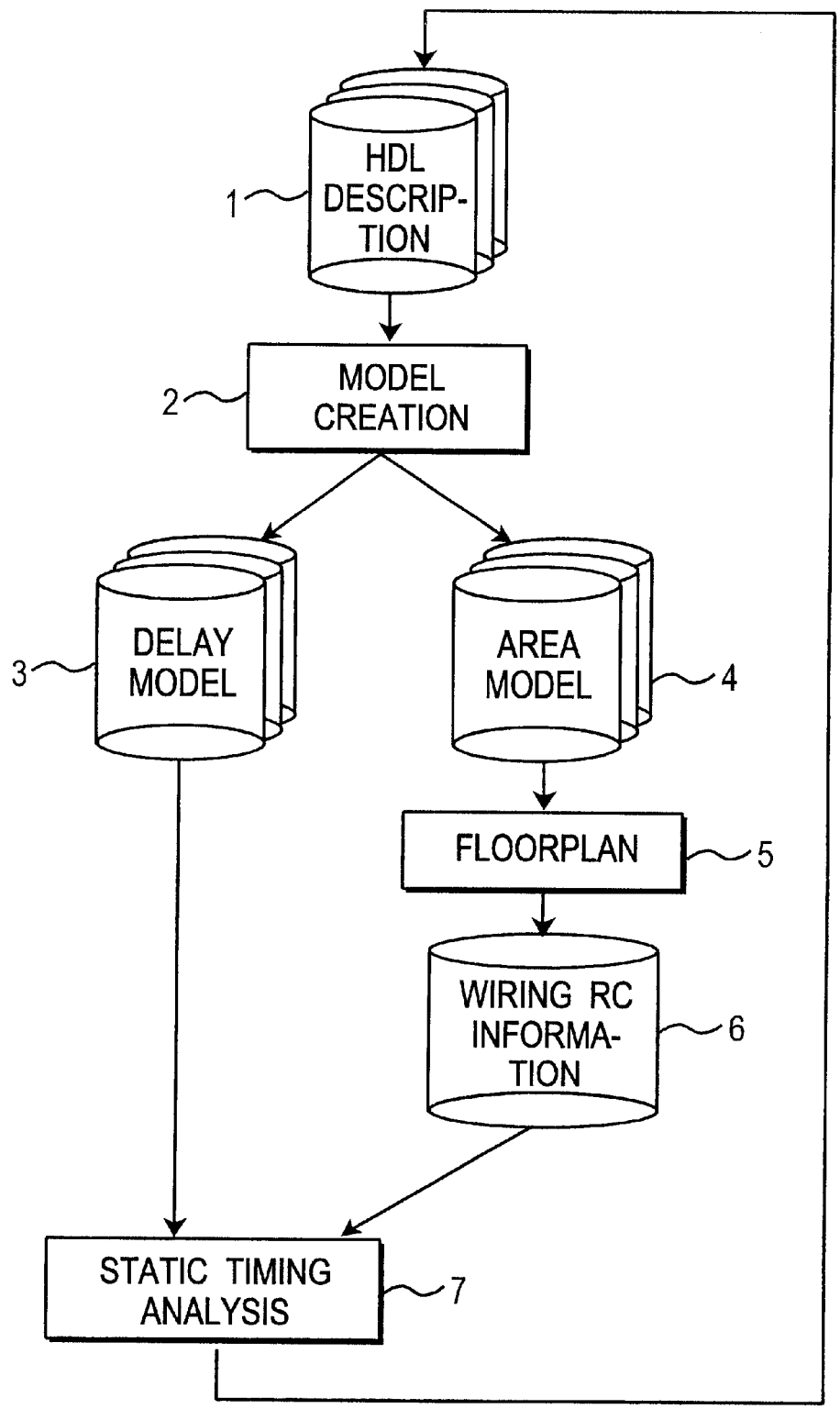
FIG. 2 is a diagram showing a flow chart of an LSI design method according to an embodiment of the present invention.

FIG. 2 shows a flow chart of an LSI design method according to an embodiment of the present invention. In contrast with the prior art design flow which involves logical synthesis after HDL creation, the present invention provides a design flow which enables selection of model creation as well as logical synthesis after HDL creation.

HDL description 1 is description at an RT level of a functional block on the assumption that synchronous design is executed with no limitation to its scale. Of course, it may be connection information (netlist) mapped to a technology.

Model creation 2 uses a CAD tool, and does not create a netlist but creates directly delay model 3 and area model 4. Delay model 3 has delay path information for a delay path defined with the outline of a functional block serving as its boundary and having an input, output, and input/output terminals serving as its starting point and ending point, for example, delay path information from an input terminal to an internal register, from an internal register to an output, or from an input to an output. Delay model 3 does not have delay path information between internal registers. Area model 4 has area information for a functional block estimated from technology-independent logical information, terminal information, and wiring prohibited position information. The estimated area information may be obtained by adding wiring regions in the model at a specified rate.

Floorplan 5 arranges area model 4 in functional blocks created through model creation processing in an intended chip size frame and carries out wiring thereof, and estimates validity for the chip size and extracts resistance (R) and parasitic capacitance (C) of wiring around the area model at the same time. Floorplan 5 may be executed for each level of a hierarchy. Wiring RC information 6 is information on resistance and parasitic capacitance of wiring around the area model extracted at the floorplan.

Static timing analysis 7 uses delay model 3 and wiring RC information 6 created in functional blocks to extract critical paths at a chip level with the CAD tool.

With the application of the flow of the present invention, since delay model 3 and area model 4 in functional blocks with no limitation to its scale are processed as a library, the number of libraries is extremely reduced, for example, as compared to the case of using a netlist in primitive functions such as INV, AND, OR, thereby reducing the TAT for processing for floorplan 5 and static timing analysis 7. Additionally, when a single functional block can be represented with a plurality of architectures, selection with a trade-off between the area and delay can be easily realized by replacing only the models for that functional block and executing floorplan 5 and static timing analysis 7. Since it is possible to manually input the estimated area value in creating area model 4 and to specify a rate at which the estimated area value is increased, the quality of floorplan 5 is not dependent on the degree of completion of the HDL, and in extreme cases, an effect can be obtained that the chip size estimation is possible in early stages of design without the HDL.

Figure 3:
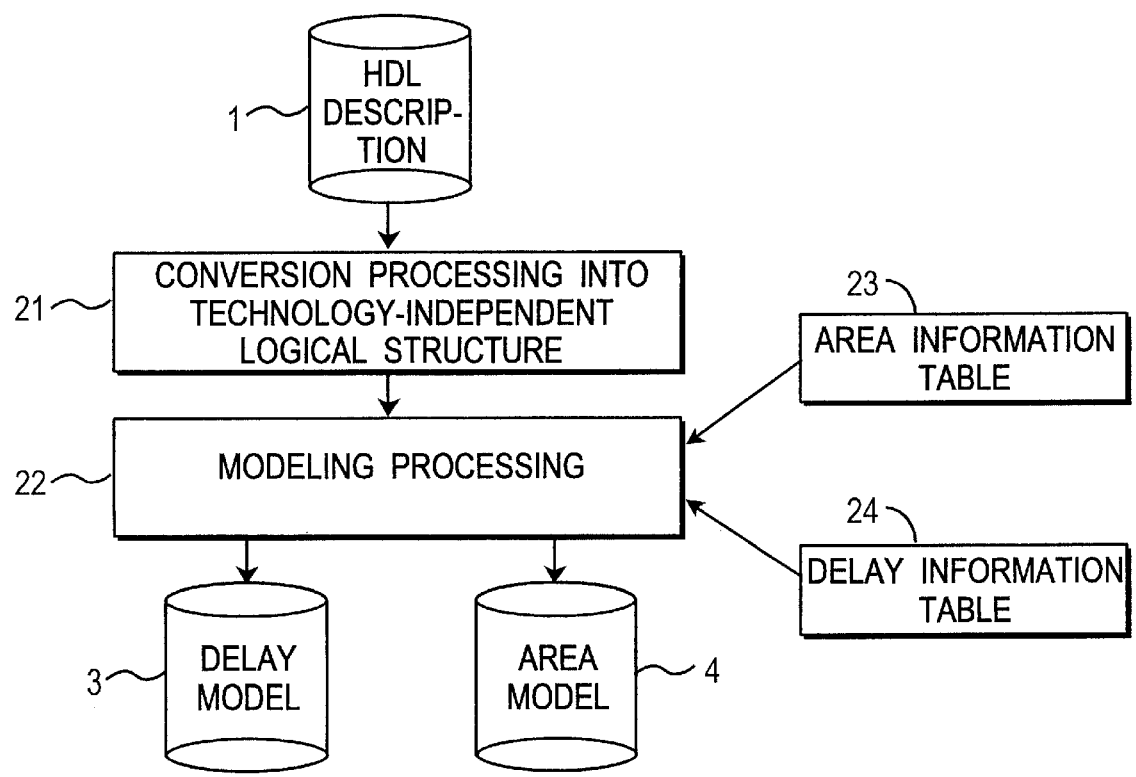
FIG. 3 is a diagram showing a model creation method of the embodiment of the present invention.

Referring to FIG. 3, there is shown a model creation method of the embodiment of the present invention. The model creation method has tables which hold area information and delay information respectively at a primitive level (INV, AND, OR or the like). Table 23 for area information has, for example, information that a two-input one-output primitive circuit (AND, OR or the like) has an area of three grids, and a two-input one-output latch, flip flop circuit (D latch, DFF or the like) has an area of 10 grids. Although the area values are previously determined values for respective technologies used, they are not area information on all cells provided for each technology but average values of areas of cells classified based on the type of cells (AND gate, flip flop or the like), the number of input pins and the number of output pins. Table 24 for delay information has delay values from a pin to another pin in a connection relationship, which information is average values of delays in cells classified based on the. number of pins, similarly to table 23 for area information. Additionally, the model creation method has processing 21 for converting HDL description 1 for a functional block into a technology-independent logical structure. With this method, modeling processing 22 is executed from the thus converted logical structure and the aforementioned two tables for area information and for delay information.

The operation of the embodiment of the present invention will be hereinafter described.

Figure 5:
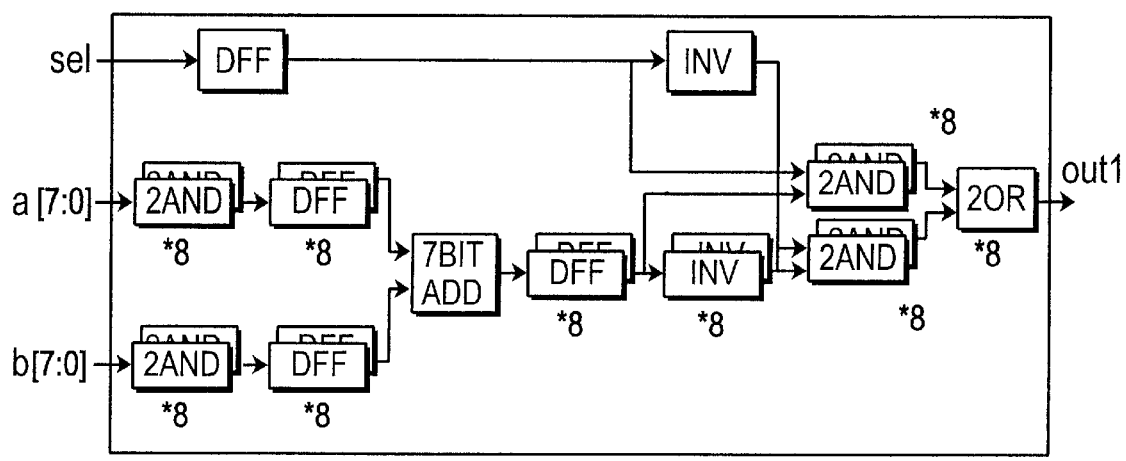
FIG. 5 is a diagram showing an example of a technology-independent logical structure.

First, HDL description for a functional block as shown in FIG. 4 is converted to a technology-independent logical structure as shown in FIG. 5. The logical structure is processed using the area information table and the delay information table to create an area model and a delay model, respectively.

The area model is obtained using an area value extended at a specified rate from the total area of respective circuits in the technology-independent logical structure in consideration of wiring regions in the model. Additionally, as a measure for avoiding a situation that a low degree of completion of an HDL may substantially affects the estimation of the area, means is provided for directly providing an area value to create the area model. Of course, the area model also includes terminal information and information on wiring prohibited region which are required at floorplan, layout and wiring.

The delay model models a critical path delay (including a setup time for DFF) from an input pin of a functional block through a combination circuit to a DFF as a setup time for the input pin of the functional block, a critical path delay from a DFF through a combination circuit to an output pin as a delay time from a clock to the output pin of the functional block, and a critical path delay from an input pin through a combination circuit to an output pin as a delay time from the input pin to the output pin. Delay information between DFFs within a functional block is not required for modeling.

The area model thus obtained is supplied to a floorplan tool together with connection information, and after layout and wiring, outputted as information on real wiring resistance (R) and capacitance (C). The information on RC is supplied to a static timing analysis tool together with the delay model and the connection information, and it is determined whether critical paths for the entire chip satisfy a required delay. value.

As another embodiment of the present invention, the basic configuration may be as described above but a manufactured CAD tool may be used for model creation.

As described above, the present invention has effects that since the delay model and the area model in functional blocks with no limitation to its scale are processed as a library, the number of libraries is extremely reduced as compared with the case of using a netlist at a primitive level (INV, AND, NOR or the like), and the TAT for processing for the floorplan and the static timing analysis is reduced.

Accordingly, the estimation of a chip size and the improvement of a critical path can be easily achieved in early stages of design.

Additionally, it is possible to easily select among a plurality of architectures while models for only one functional block are replaced.

Furthermore, since an area value can be manually inputted or a rate at which an estimated value is increased can be specified in creating the area model, the quality of the floorplan is not dependent on the degree of completion of the HDL, and in extreme cases, there exists an effect that a chip size can be estimated in early stages of design without an HDL.

What is claimed is:

1. The LSI design system through model creation for a functional block, comprising:

an HDL description for a functional block described in an HDL (Hardware Description Language);

model creating means for creating a delay model and an area model from said HDL description;

a library of said delay model in functional blocks having information on a delay path defined with an outline of the functional block serving as its boundary and having an input, output, and input/output terminal serving as its starting point and ending point;

a library of said area model in functional blocks having area information for a functional block estimated from technology-independent logical information, terminal information, and wiring prohibited position information;

floorplan means for arranging said area model in an intended chip size frame and carrying out wiring thereof, and estimating validity for the chip size and extracting wiring RC information of resistance and parasitic capacitance of wiring around said area model at the same time;

said wiring RC information extracted by said floorplan means; and static timing analyzing means for extracting critical paths at a chip level with a CAD tool by using said delay model and said wiring RC information, wherein said model creating means includes:

conversion processing means for converting said HDL description for a functional block into a technology-independent logical structure;

an area information table not having area information of cells of all primitive circuits provided for each technology, but having average values of areas of the cells classified based on types of the cells and the number of input pins and output pins;

a delay information table having delay values from a pin to another pin in a connection relationship, the values being average values of delays in cells classified based on the number of pins similarly to said area information table;

modeling means for executing modeling from the logical structure converted by said conversion processing means, said area information table, and said delay information table into said area model and said delay model;

said modeling means for modeling into said area model having means for obtaining said area model using an area value extended at a specified rate from the total area of respective circuits in the technology-independent logical structure in consideration of wiring region in the model; and said modeling means for modeling into said delay model having means for modeling a critical path delay from an input pin of a functional block through a combination circuit to a DFF as a setup time for the input pin of the functional block, a critical path delay from a DFF through a combination circuit to an output pin as a delay time from a clock to the output pin of the functional block, and a critical path delay from an input pin through a combination circuit to an output pin as a delay time from the input pin to the output pin.

2. The LSI design system through model creation for a functional block according to claimed 1, wherein said modeling means for modeling into said area model has means for directly providing an area value to create an area model.

3. An LSI design method for said LSI design system through model creation for a functional block, comprising:

an HDL description for a functional block described in an HDL (Hardware Description Language);

model creating means for creating a delay model and an area model from said HDL description;

a library of said delay model in functional blocks having information on a delay path defined with an outline of the functional block serving as its boundary and having an input, output, and input/output terminal serving as its starting point and ending point;

a library of said area model in functional blocks having area information for a functional block estimated from technology-independent logical information, terminal information, and wiring prohibited position information;

floorplan means for arranging said area model in an intended chip size frame and carrying out wiring thereof, and estimating validity for the chip size and extracting wiring RC information of resistance and parasitic capacitance of wiring around said area model at the same time;

said wiring RC information extracted by said floorplan means; and static timing analyzing means for extracting critical paths at a chip level with a CAD tool by using said delay model and said wiring RC information, said method comprising the steps of:

describing said HDL description;

creating said delay model and said area model from said HDL description with said model creation means;

arranging said area model in an intended chip size frame and carrying out wiring thereof, and estimating validity for the chip size and extracting wiring RC information of resistance and parasitic capacitance of wiring around said area model at the same time with said floorplan means; and extracting critical paths at a chip level with a CAD tool by using said delay model and said wiring RC information with said static timing analyzing means.

4. The LSI design method for said LSI design system through model creation for a functional block according to claim 3, wherein said step of creating said delay model and said area model includes the steps of:

converting said HDL description for a functional block into a technology-independent logical structure with conversion processing means; and executing modeling from the logical structure converted by said conversion processing means, an area information table, and a delay information table into said area model and said delay model with modeling means;

said area information table not having area information of cells of all primitive circuits provided for each technology, but having average values of areas of the cells classified based on types of the cells and the number of input pins and output pins;

said delay information table having delay values from a pin to another pin in a connection relationship, the values being average values of delays in cells classified based on the number of pins similarly to said area information table;

said step of modeling into said area model having the step of obtaining said area model using an area value extended at a specified rate from the total area of respective circuits in the technology-independent logical structure in consideration of wiring region in the model;

said step of modeling into said delay model having the step of modeling a critical path delay from an input pin of a functional block through a combination circuit to a DFF as a setup time for the input pin of the functional block, a critical path delay from a DFF through a combination circuit to an output pin as a delay time from a clock to the output pin of the functional block, a critical path delay from a DFF through a combination circuit to an output pin as a delay time from a clock to the output pin of the functional block, and a critical path delay from an input pin through a combination circuit to an output pin as a delay time from the input pin to the output pin.

5. The LSI design method for said LSI design system through model creation for a functional block according to claim 4, wherein said step of modeling into said area model has the step of directly providing an area value to create an area model.

* * * * *

UNITED STATES PATENT AND TRADEMARK OFFICE
CERTIFICATE OF CORRECTION

PATENT NO. : 6,463,567 B1
DATED : October 8, 2002
INVENTOR(S) : Kozai

It is certified that error appears in the above-identified patent and that said Letters Patent is hereby corrected as shown below:

Column 7,
Line 17, "claimed" should be -- claim --.

Signed and Sealed this

Twenty-third Day of March, 2004

JON W. DUDAS
*Acting Director of the United States Patent and Trademark Office*